US010251312B2

(12) United States Patent
Sloan et al.

(10) Patent No.: US 10,251,312 B2
(45) Date of Patent: Apr. 2, 2019

(54) COOLING SYSTEMS FOR DEVICES ARRANGED IN ROWS

(71) Applicants: Philip Sloan, Dubuque, IA (US); Nicholas L. Kaufmann, Sherrill, IA (US); Kevin J. Gebke, Dubuque, IA (US); Frank Heim, Platteville, WI (US)

(72) Inventors: Philip Sloan, Dubuque, IA (US); Nicholas L. Kaufmann, Sherrill, IA (US); Kevin J. Gebke, Dubuque, IA (US); Frank Heim, Platteville, WI (US)

(73) Assignee: Rite-Hite Holding Corporation, Milwaukee, WI (US)

( * ) Notice: Subject to any disclaimer, the term of this patent is extended or adjusted under 35 U.S.C. 154(b) by 115 days.

(21) Appl. No.: 15/261,280

(22) Filed: Sep. 9, 2016

(65) Prior Publication Data

US 2018/0077822 A1 Mar. 15, 2018

(51) Int. Cl.
*H05K 7/00* (2006.01)
*H05K 7/20* (2006.01)

(52) U.S. Cl.
CPC ........... *H05K 7/20745* (2013.01); *H05K 7/20* (2013.01); *H05K 7/20009* (2013.01);
(Continued)

(58) Field of Classification Search
None
See application file for complete search history.

(56) References Cited

U.S. PATENT DOCUMENTS 2,013,724 A 9/1935 Brady
3,699,872 A 10/1972 Kruger
(Continued)

FOREIGN PATENT DOCUMENTS

DE 1956659 6/1970
DE 20010135 9/2000
(Continued)

OTHER PUBLICATIONS

International Searching Authority, "International Search Report and Written Opinion," issued in connection with PCT Application No. PCT/US2016/059843, dated Feb. 6, 2017, 15 pages.
(Continued)

*Primary Examiner* — Dimary S Lopez Cruz
*Assistant Examiner* — Zhengfu J Feng
(74) *Attorney, Agent, or Firm* — Hanley, Flight & Zimmerman, LLC

(57) ABSTRACT

Cooling systems for devices arranged in rows are disclosed. An example cooling system includes an inflatable air duct to be positioned above a cold aisle defined between two rows of electronic equipment. The inflatable air duct is to be air permeable to deliver conditioned air into the cold aisle. The electronic equipment has fans to force cool air within the cold aisle through the electronic equipment to adjacent hot aisles on opposite sides of the two rows of the electronic equipment. The inflatable air duct to be spaced apart from the rows of computers such that the cold aisle is in unobstructed fluid communication with the adjacent hot aisles over top of the rows of electronic equipment. The conditioned air delivered from the inflatable air duct to substantially prevent a mixing of warm air in the hot aisles with the cool air in the cold aisle.

16 Claims, 15 Drawing Sheets

(52) U.S. Cl.
CPC ..... *H05K 7/20127* (2013.01); *H05K 7/20136* (2013.01); *H05K 7/20145* (2013.01); *H05K 7/20172* (2013.01); *H05K 7/20536* (2013.01); *H05K 7/20554* (2013.01)

(56) References Cited

U.S. PATENT DOCUMENTS

| | | | |
|---|---|---|---|
| 3,726,203 A | 4/1973 | Lindestrom | |
| 3,824,909 A | 7/1974 | Horneff et al. | |
| 4,890,544 A | 1/1990 | Aalto et al. | |
| 5,044,259 A * | 9/1991 | Catan | F24F 7/065 |
| | | | 454/305 |
| 5,094,273 A | 3/1992 | Eagleton | |
| 5,111,739 A | 5/1992 | Hall | |
| 5,137,057 A | 8/1992 | Hummert, III | |
| 5,285,818 A | 2/1994 | Hummert, III | |
| 5,490,813 A | 2/1996 | Danielsen et al. | |
| 6,113,486 A | 9/2000 | Beudon et al. | |
| 6,558,250 B1 | 5/2003 | Paschke | |
| 6,565,430 B2 | 5/2003 | Gebke | |
| 6,953,396 B2 | 10/2005 | Paschke et al. | |
| 6,960,130 B2 | 11/2005 | Gebke et al. | |
| 9,103,117 B1 | 8/2015 | Lundskog et al. | |
| 9,152,191 B1 | 10/2015 | Gardner | |
| 9,485,887 B1 | 11/2016 | Eichelberg et al. | |
| 9,894,809 B1 | 2/2018 | Springs et al. | |
| 2003/0022617 A1 | 1/2003 | Gebke et al. | |
| 2004/0198215 A1 | 10/2004 | Bridenne et al. | |
| 2004/0229559 A1 | 11/2004 | Gebke et al. | |
| 2005/0225936 A1 * | 10/2005 | Day | H05K 7/20754 |
| | | | 361/679.47 |
| 2005/0250436 A1 | 11/2005 | Nilsson | |
| 2006/0252365 A1 | 11/2006 | Gebke | |
| 2007/0281639 A1 | 12/2007 | Clidaras et al. | |
| 2008/0158818 A1 | 7/2008 | Clidaras et al. | |
| 2008/0176506 A1 | 7/2008 | Gebke et al. | |
| 2008/0291625 A1 | 11/2008 | Rathbun, II et al. | |
| 2009/0046427 A1 | 2/2009 | Noteboom et al. | |
| 2009/0173017 A1 | 7/2009 | Hall | |
| 2009/0210096 A1 | 8/2009 | Stack et al. | |
| 2010/0048121 A1 | 2/2010 | Klopfenstein et al. | |
| 2010/0061057 A1 | 3/2010 | Dersch et al. | |
| 2010/0216388 A1 * | 8/2010 | Tresh | H05K 7/20745 |
| | | | 454/184 |
| 2011/0269390 A1 | 11/2011 | Pinkalla et al. | |
| 2011/0319006 A1 * | 12/2011 | Gilder | F24F 13/078 |
| | | | 454/184 |
| 2012/0006442 A1 | 1/2012 | Gebke et al. | |
| 2012/0125472 A1 | 5/2012 | Pinkalla et al. | |
| 2013/0255973 A1 | 10/2013 | Prieur | |
| 2014/0202540 A1 | 7/2014 | Gebke et al. | |
| 2014/0254090 A1 | 9/2014 | Gardner | |
| 2016/0029513 A1 * | 1/2016 | Gardner | G06F 1/206 |
| | | | 700/276 |
| 2017/0127574 A1 | 5/2017 | Heim et al. | |

FOREIGN PATENT DOCUMENTS

| | | |
|---|---|---|
| EP | 0856709 | 8/1998 |
| GB | 1589196 | 5/1981 |
| GB | 2120778 | 12/1983 |
| WO | 2006119399 | 11/2006 |
| WO | 2010095931 | 8/2010 |

OTHER PUBLICATIONS

United States Patent and Trademark Office, "Non-Final Office Action," issued in connection with U.S. Appl. No. 14/932,676, dated May 8, 2017, 42 pages.

United States Patent and Trademark Office, "Notice of Allowance," issued in connection with U.S. Appl. No. 14/932,676, dated Sep. 18, 2017, 19 pages.

International Searching Authority, "International Search Report and Written Opinion," issued in connection with International Patent Application No. PCT/US2017/050092, dated Nov. 21, 2017, 17 pages.

United States Patent and Trademark Office, "Non-final Office Action," issued in connection with U.S. Appl. No. 15/899,280, dated Nov. 20, 2018, 57 pages.

United States Patent and Trademark Office, "Non-final Office Action," issued in connection with U.S. Appl. No. 15/899,278, dated Nov. 20, 2018, 45 pages.

Australian Intellectual Property Office, "Examination Report," issued in connection with Australian application No. 2016350706, dated Nov. 1, 2018, 20 pages.

* cited by examiner

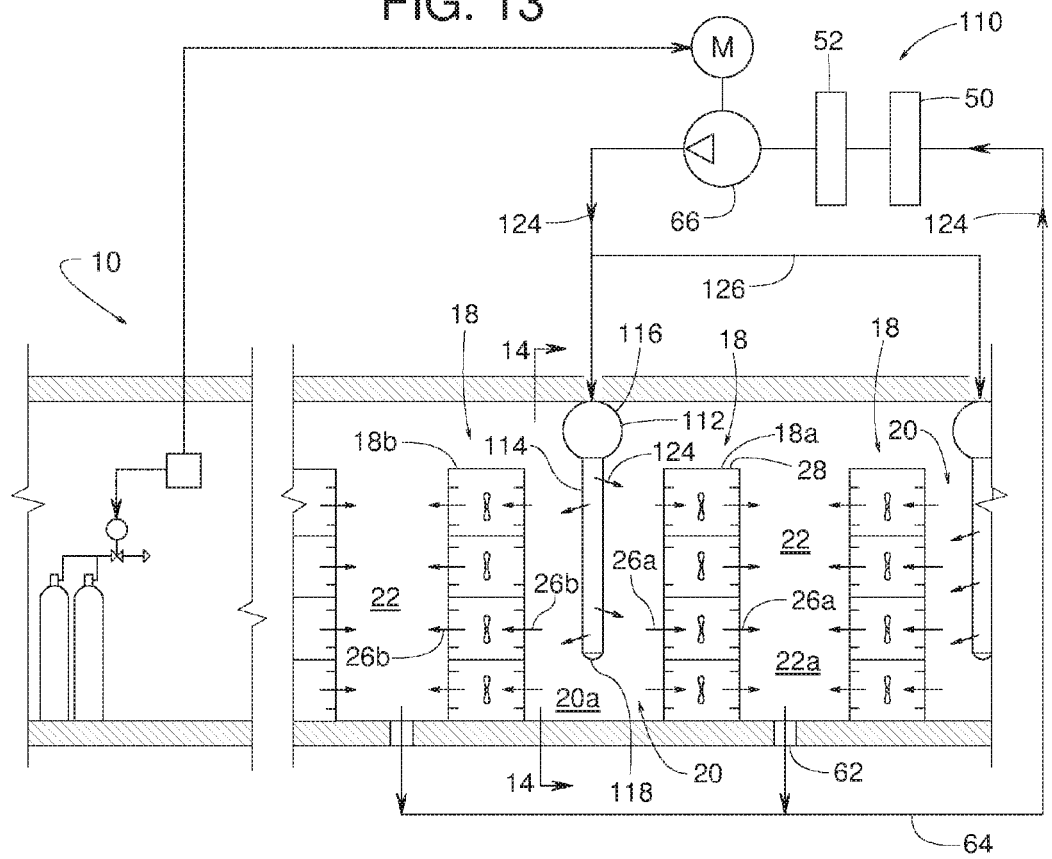
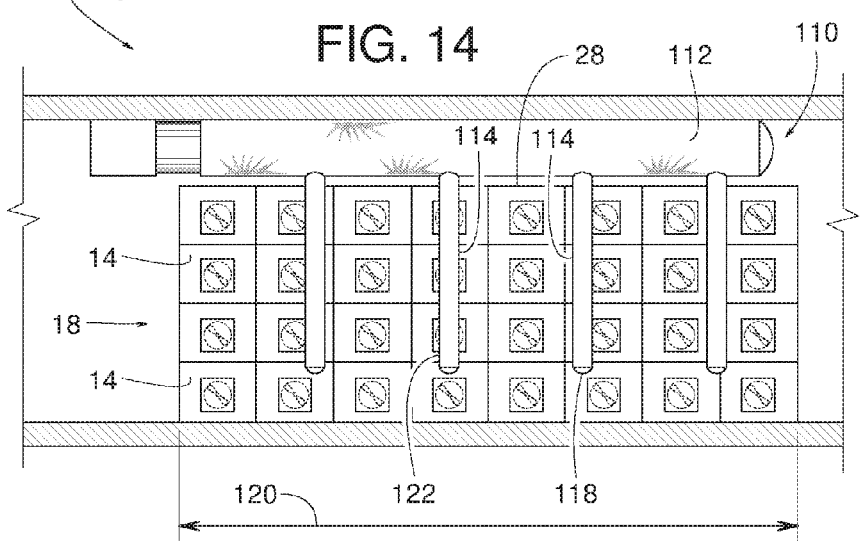

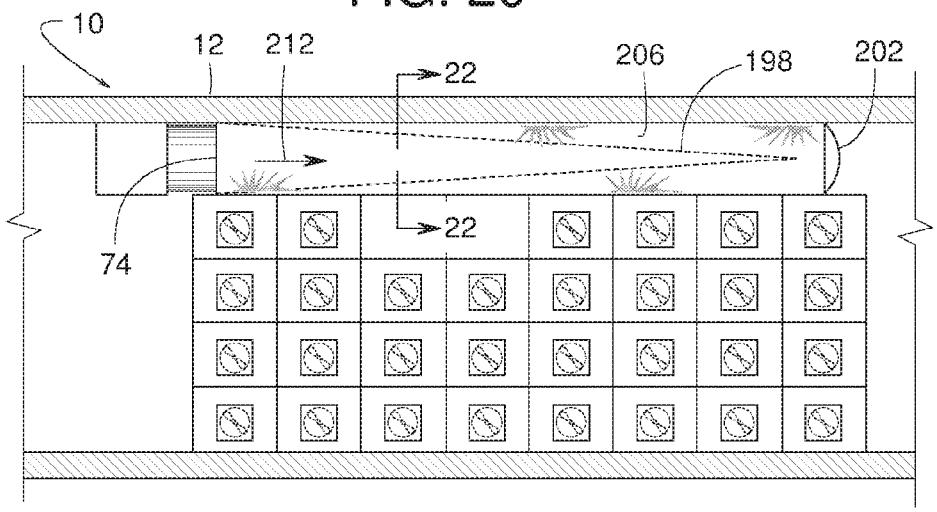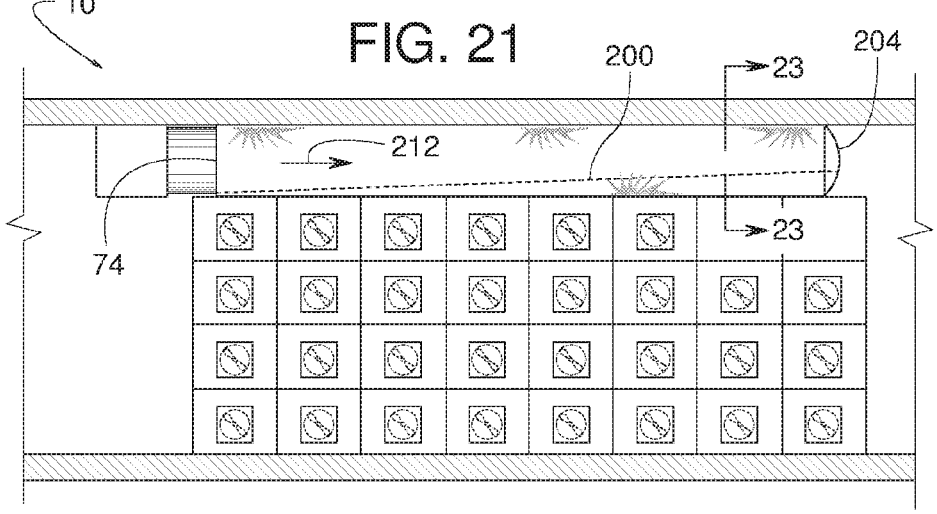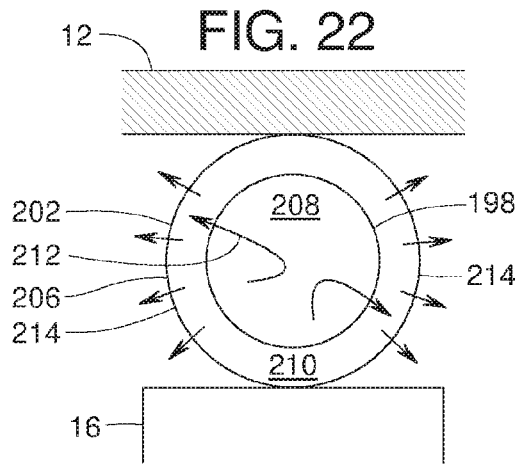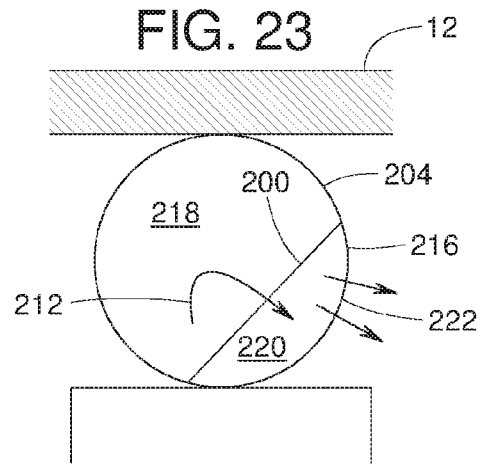

COOLING SYSTEMS FOR DEVICES ARRANGED IN ROWS

FIELD OF THE DISCLOSURE

This patent generally pertains to cooling systems and more specifically to cooling systems for devices arranged in rows.

BACKGROUND

Server-based datacenters, sometimes known as server farms or server clusters, are a large collection of computers, often at a physically remote but network accessible location, that provide clients with expanded computing capability. The expanded computing capability typically is in the form of data storage, data processing, database management, file management, and website management.

Each computer of the system usually includes a base or case supporting a set of computer components. Depending on the application, computer components may include items such as one or more microprocessors, hard drives, solid state memory devices, routers and power supplies. More generally, there are many types of electronic equipment and/or other devices that may emit heat to the surrounding area during operation. To maintain such components at a safe operating temperature, the base or case of each computer or other heat generating device usually includes or is otherwise associated with a cooling fan that forces a current of environmentally controlled air from a front face of the computer or other device, across the components, and out through a back end of the computer or other device. In some cases, it is this current of air that defines the front and back ends of the computer or other device.

Somewhat resembling books in an open bookshelf, computers at a datacenter may be stacked in rack-like cabinets that are neatly arranged in rows separated by aisles. The aisles provide manual access to the front and back ends of the computers. The rows of computers are oriented such that each individual aisle is exposed solely to computer fronts or solely to computer backs. Thus, the front ends of computers in one row face the front ends of computers in the next row across the aisle. In the very next aisle, the back ends of computers on opposite sides of that aisle face each other. Aisles of computer fronts are generally cooler than backside aisles due to the computer components heating the current of air developed by the computers' internal cooling fans. Thus, front side cooler aisles are often called "cold aisles," and back side aisles are known as "hot aisles." Each aisle being exposed to only computer fronts or to only computer backs creates an alternating arrangement of cold aisles and hot aisles. Similar arrangements of other types of electronic equipment or other devices that generate heat may be implemented to cool such devices during operation.

Datacenters usually run nonstop and generate a lot of heat. Consequently, a building air conditioning system is usually needed to prevent the computers from overheating. In the event of a fire, a generally inert gas system or some other type of fire suppression system automatically activates to prevent or reduce (e.g., minimize) damage.

BRIEF DESCRIPTION OF THE DRAWINGS

FIG. 13 is a cross-sectional view similar to FIG. 3 but showing another example cooling system constructed in accordance with the teachings disclosed herein.

FIG. 14 is a cross-sectional view taken along line 14-14 of FIG. 13.

FIG. 20 is a cross-sectional view similar to FIG. 19 but showing another example cooling system constructed in accordance with the teachings disclosed herein.

FIG. 21 is a cross-sectional view similar to FIGS. 19 and 20 but showing another example cooling system constructed in accordance with the teachings disclosed herein.

FIG. 22 is a cross-sectional view taken along line 22-22 of FIG. 20.

FIG. 23 is a cross-sectional view taken along line 23-23 of FIG. 21.

DETAILED DESCRIPTION

Example cooling systems for server-based datacenters, or server farms, include air permeable inflatable air ducts installed above multiple rows of computer racks. In some examples, in the event of a fire, the air ducts deflate and collapse so as not to obstruct the flow of a fire extinguishing gas. In some examples, when inflated, the air ducts have an expanded shape that inhibits adverse mixing of air between hot aisles and cold aisles. In some examples, wings extend laterally from the air duct to further reduce the mixing of hot and cold air. In some examples, a series of inflatable branch ducts extend downward from a supply air duct to reach well into cold aisles. In some examples, nozzles and/or internal baffles promote radial air discharge from the supply air duct.

Figure 1:
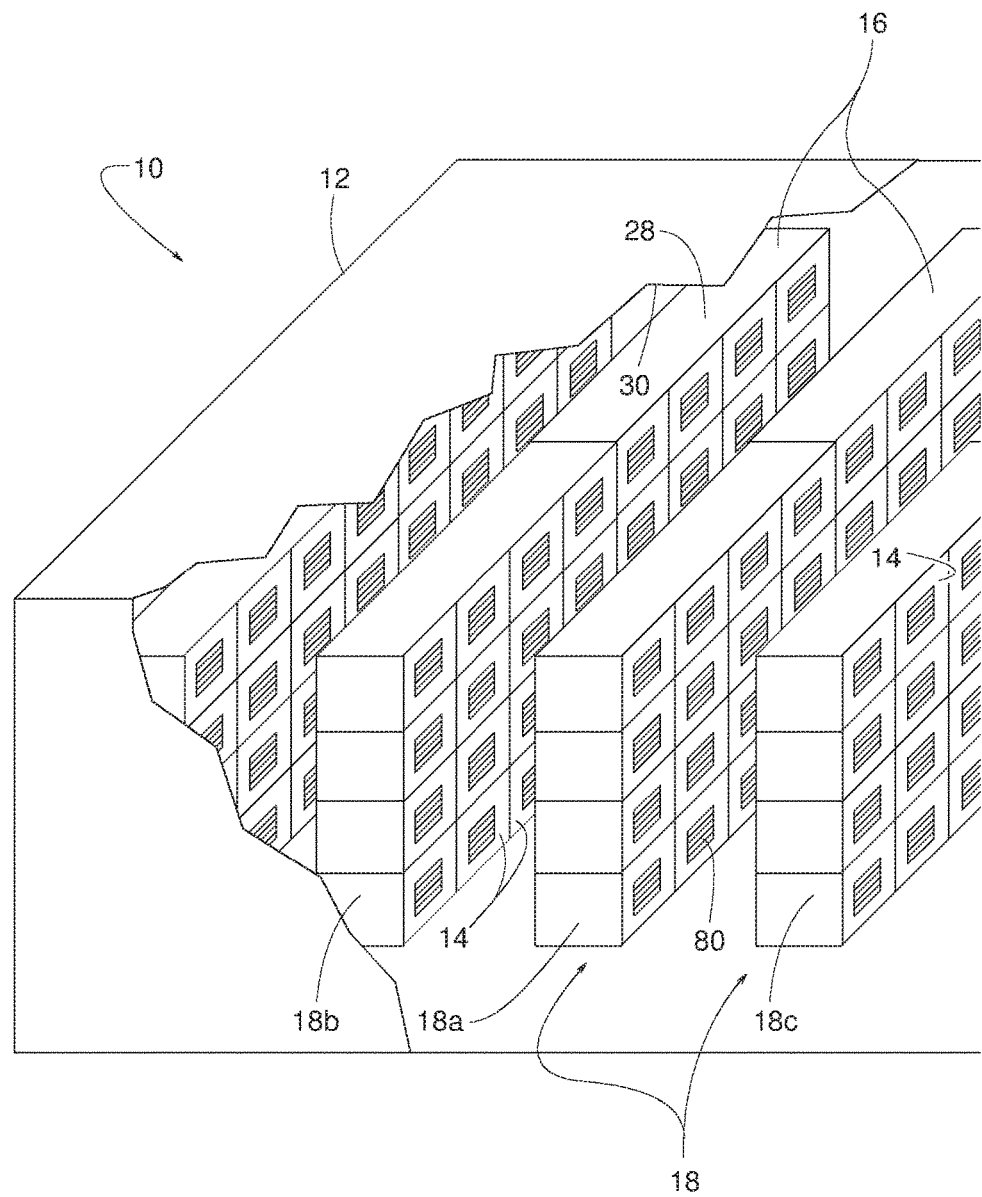
FIG. 1 is a cutaway perspective view of an example datacenter or server farm constructed in accordance with the teachings disclosed herein.
Figure 2:
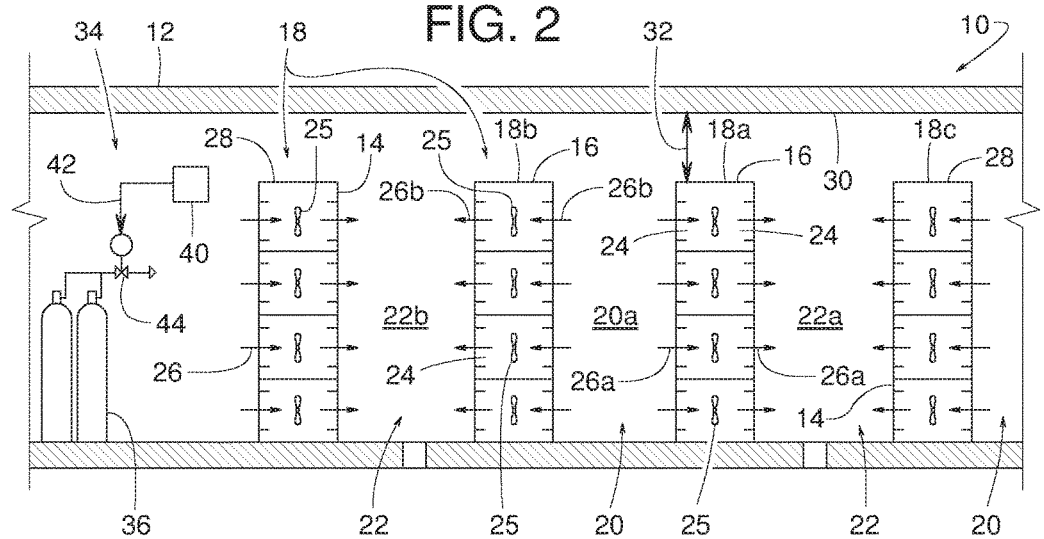
FIG. 2 is a cross-sectional end view of the example datacenter shown in FIG. 1.

FIGS. 1 and 2 show an example datacenter 10 including a building 12 containing a plurality of computers 14 in a plurality of cabinets 16. The term, "computer" refers to any digital processing device, examples of which include a server, a data storage device, a hard drive, a solid state memory, etc. The term, "cabinet" refers to any structure for supporting and/or housing one or more of the plurality of computers 14. Examples of a cabinet include a plurality of enclosures supporting and/or housing at least one computer, a single enclosure containing a single computer, a single enclosure housing a plurality of computers, a rack, a shelf, etc. In examples where a plurality of computers are housed or supported by or within one or more cabinets, the term, "row of computers" encompasses the associated cabinets (i.e., the racks, shelving, and/or other enclosure or support for the computers). So, in some examples, the terms, "row of computers" and "row of cabinets" can be used interchangeably. Although the teachings of this disclosure are described with respect to rows of computers, the teachings of this disclosure may apply to any other type of electronic equipment or devices that are to be cooled through forced air when arranged in one or more rows.

In the illustrated example, the cabinets 16 are arranged in a plurality of rows 18 to create a first row of computers 18a (a first row of cabinets) and a second row of computers 18b (a second row of cabinets). The plurality of rows of computers 18 also creates an alternating arrangement of a plurality of cold aisles 20 (e.g., a first aisle 20a) and a plurality of hot aisles 22 (e.g., a second aisle 22a and a third aisle 22b). In some examples, there may be only a single hot aisle and a single cold aisle. As used herein, the term "aisle" refers to the space between adjacent rows of computers 18 as well as the space adjacent the outer side of an outer row of the plurality of rows 18. Thus, in some examples, there may be only a single row of computers 18 that defines hot and cold aisles on either side without adjacent rows on either side of the single row of computers 18. The terms, "hot" and "cold" in reference to an aisle merely means that the average air temperature of the hot aisle is greater than that of the cold aisle. The terms, "hot aisle" and "cold aisle" do not suggest that either aisle is at any particular absolute temperature. At least one computer 14 and/or at least one row of cabinets 16 define an air passageway 24 between a cold aisle 20a and one or more hot aisles 22a, 22b. One or more internal fans 25 within the air passageway 24 creates a current of air 26 (e.g., a first current of air 26a from the cold aisle 20a (the first aisle) to the first hot aisle 22a (the second aisle) and/or a second current of air 26b from the cold aisle 20a to the second hot aisle 22b (the third aisle)) for cooling the internal components of the computers 14. The cabinets 16 have a top surface 28 that is below and spaced apart from an overhead surface 30 of the building 12 to create a gap 32 between the top surface 28 and the overhead surface 30.

In the illustrated example, the datacenter 10 also includes a fire suppression system 34. In some examples, the fire suppression system 34 includes one or more pressurized tanks 36 of a fire extinguishing fluid 38 (FIG. 4) such as halon, halocarbons, carbon dioxide or an inert gas. In the event of a fire-related incident (e.g., fire, heat, smoke, manually triggered fire alarm, etc.), a sensor 40 detects and responds to the incident by sending a signal 42 that opens a valve 44, which releases the fire extinguishing fluid 38 from the tanks 36 to displace the oxygen surrounding the rows of computers 18.

Figure 3:
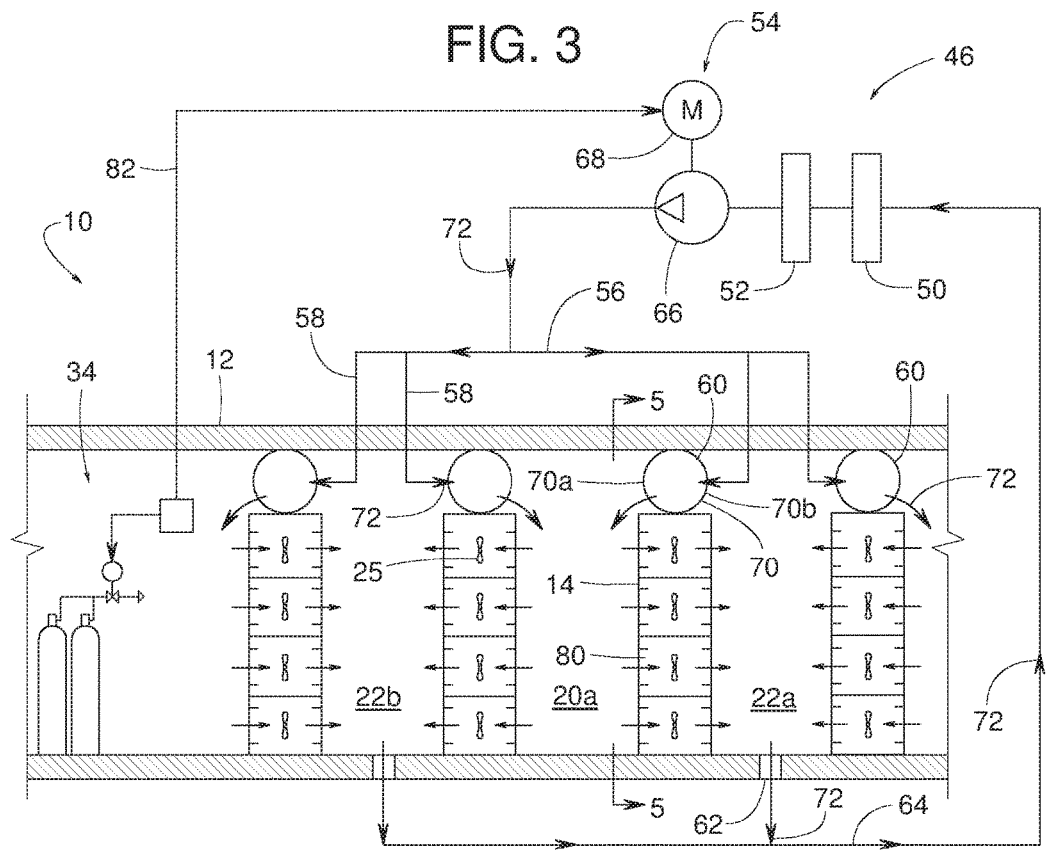
FIG. 3 is cross-sectional end view similar to FIG. 2 but showing an example cooling system of the example datacenter constructed in accordance with the teachings disclosed herein, wherein portions of the example cooling system are schematically illustrated.
Figure 4:
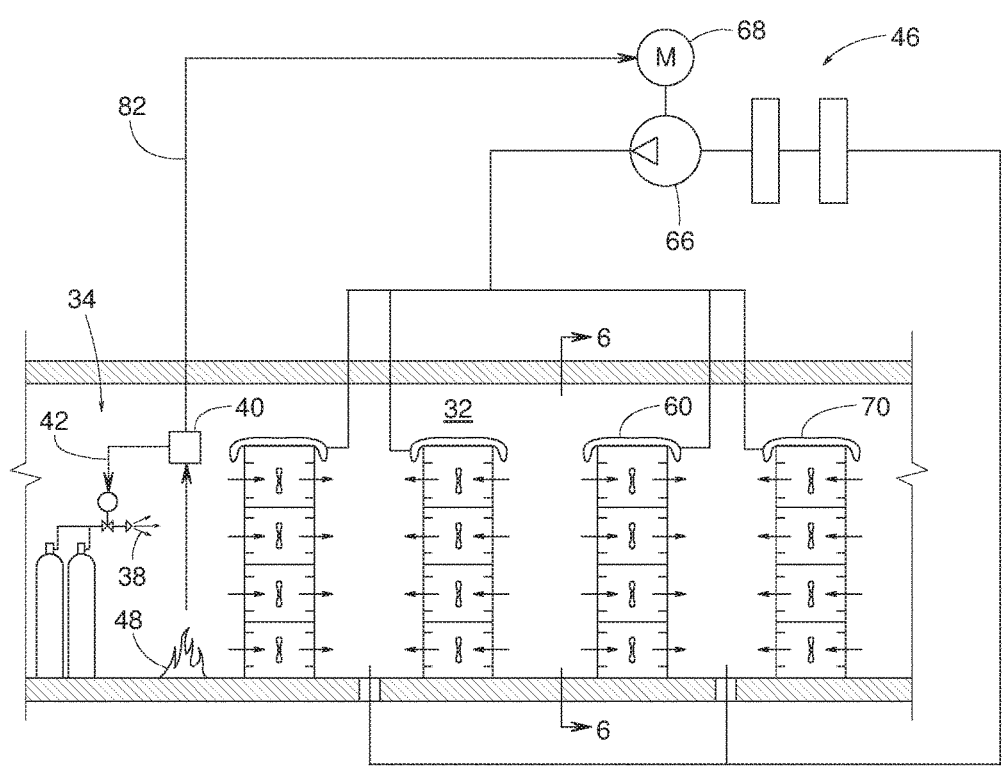
FIG. 4 is cross-sectional end view similar to FIG. 3 but showing example air ducts of the example cooling system in a deflated state as opposed to the inflated state shown in FIG. 3.

FIG. 3-6 show the addition of an example cooling system 46 for efficiently extracting heat generated by the computers 14 during normal operation without interfering with the fire suppression system 34 during a fire 48 (FIG. 4). In this example, the cooling system 46 includes an air filter 50, a known cooling coil 52 (e.g., a water, glycol, or refrigerant cooled heat exchanger), a blower system 54, a supply air manifold 56, at least one branch air duct 58, at least one supply air duct 60, at least one return air register 62, and a return air manifold 64. The term, "blower system" refers to one or more blowers 66 powered by at least one motor 68. The supply air duct 60 is inflatable by virtue of its tubular wall 70 (e.g., 70a and 70b) being made of a pliable material (e.g. air permeable sheet, air impermeable sheet, nonmetallic sheet, coated fabric, uncoated fabric, and various combinations thereof). The term, "pliable" refers to a material that can be crumpled and later straightened without appreciable damage to the material. The term, "inflatable" as it relates to an air duct means that the duct's internal volume expands with internal air pressure and tends to collapse when the pressure is removed.

Figure 5:
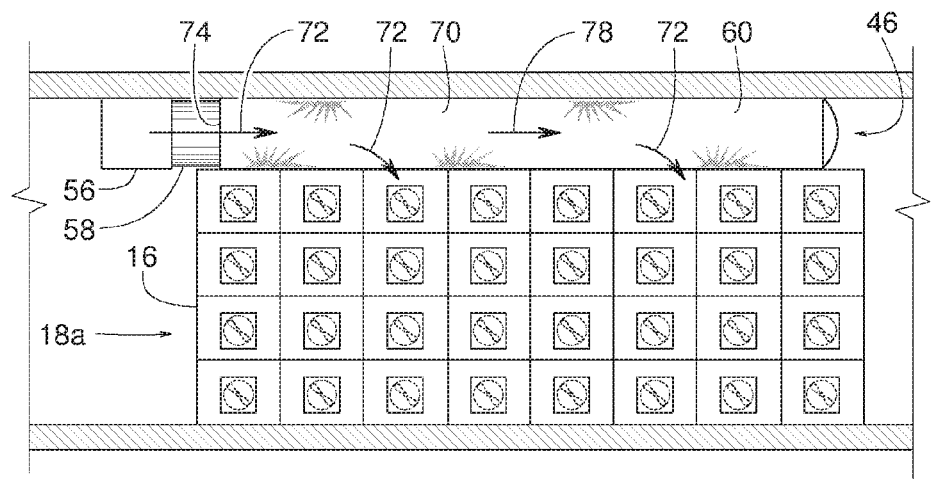
FIG. 5 is a cross-sectional view taken along line 5-5 of FIG. 3.

During normal operation, as shown in FIGS. 3 and 5, the blower 66 draws air 72 from the return air manifold 64, through the filter 50, and through the cooling coil 52. The blower 66 then discharges the filtered cool air through the supply air manifold 56, through the branch air ducts 58 and into an axial end 74 of each supply air duct 60. In the illustrated example, the discharge pressure of blower 66 inflates or fully expands each supply air duct 60. The supply air duct 60 in its expanded state, as shown in the examples of FIGS. 3 and 5, creates an obstruction that substantially fills or blocks gap 32 between the top surface 28 and the overhead surface 30. In some examples, the supply air duct 60 spans the entire gap 32 so as to be in contact with both the top surface 28 and the overhead surface 30 when inflated. The supply air duct 60 blocking the gap 32 reduces (e.g., minimizes) the mixing of cold and warm air between the cold aisle 20a and the hot aisle 22a.

Figure 18:
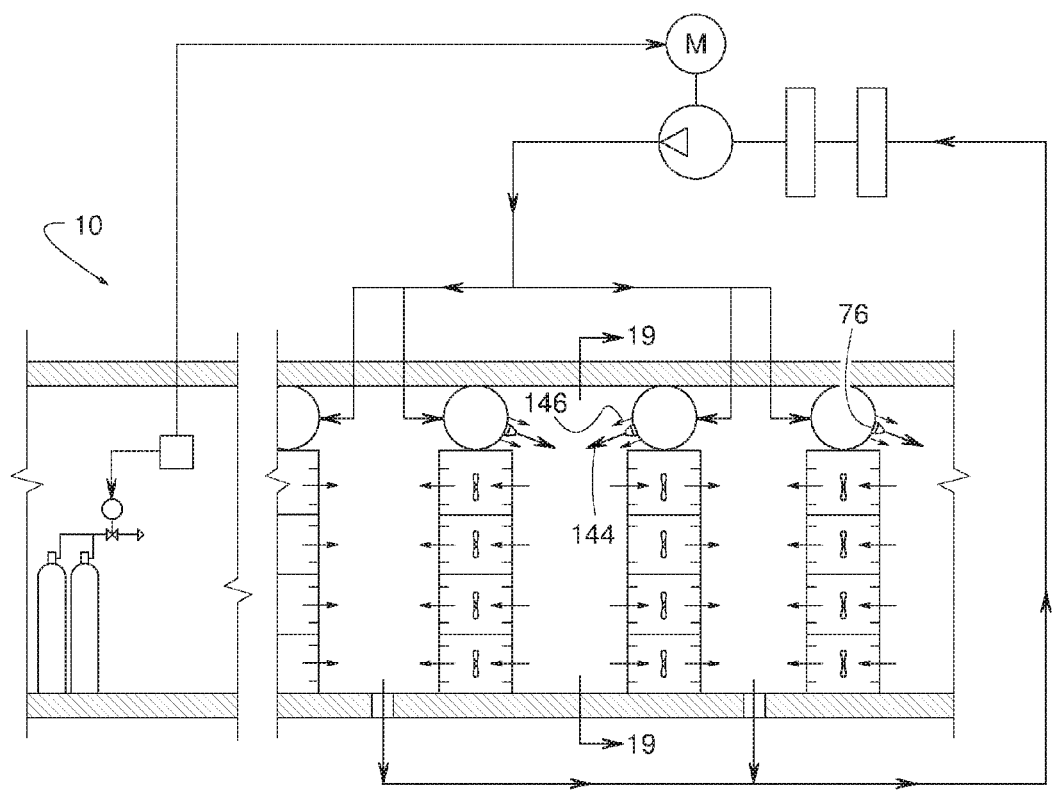
FIG. 18 is a cross-sectional view similar to FIG. 3 but showing another example cooling system constructed in accordance with the teachings disclosed herein.
Figure 19:
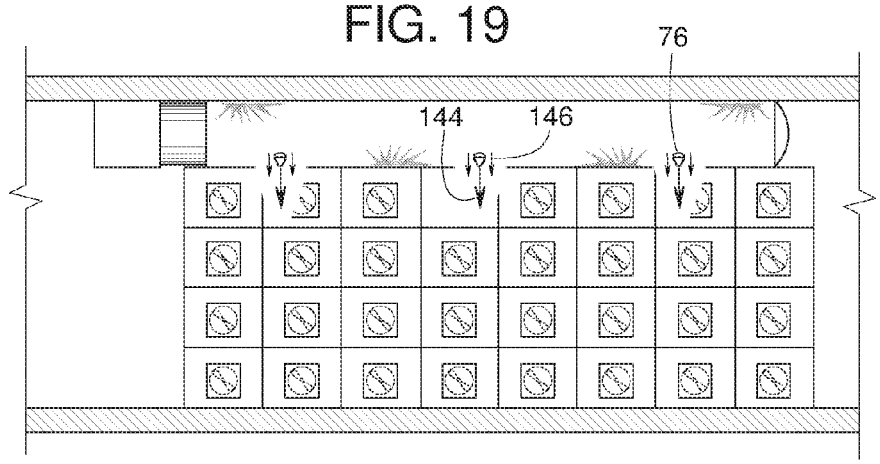
FIG. 19 is a cross-sectional view taken along line 19-19 of FIG. 18.

In this example, each supply air duct 60 has an air permeable sidewall 70a facing the cold aisle 20a and a substantially impermeable opposite sidewall 70b facing the hot aisle 22a. The sidewall 70a is made permeable by any suitable means, examples of which include porosity in the material of the tubular wall 70a, perforations in the tubular wall 70a, and/or the sidewall 70a having one or more nozzles 76 (FIGS. 18 and 19). In examples where only the sidewall 70a is air permeable, air discharged from the blower 66 flows lengthwise 78 (FIG. 5) through the supply air duct 60, radially outward through the sidewall 70a, and downward into the cold aisle 20a. From the cold aisle 20a, the cool air flows through the computers 14 via an air passageway 80 (through the computers 14 and/or through the cabinets 16), into the hot aisle 22a, and downward toward the return register 62. The register 62 conveys the air from the hot aisle 22a into the return manifold 64, which returns the air back to the filter 50 for recirculation.

Figure 6:
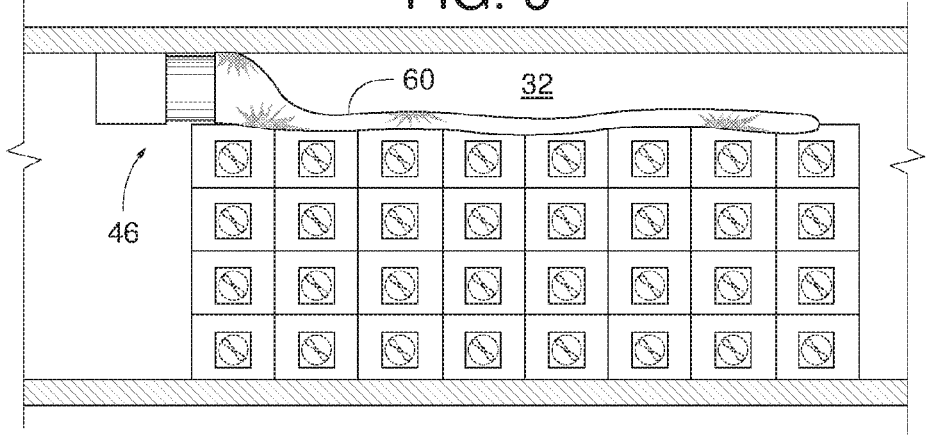
FIG. 6 is a cross-sectional view taken along line 6-6 of FIG. 4.

In some examples, in the event of a fire 48 or a fire-related incident (e.g., flame, smoke, heat, manually triggered fire alarm, etc.), the sensor 40 responds by sending the signal 42 to activate the fire suppression system 34, as described earlier, and also sends a signal 82 that de-energizes the motor 68 and, thus, stops the blower 66. Stopping the blower 66 depressurizes the supply air duct 60, which causes the supply air duct 60 to collapse to its deflated state, as shown in FIGS. 4 and 6. In the deflated state, the collapsed supply air duct 60 opens or substantially unblocks the gap 32 so that the fire extinguishing fluid 38 in a gaseous state can readily disperse over, around and through the multiple rows of computers 18.

Figure 7:
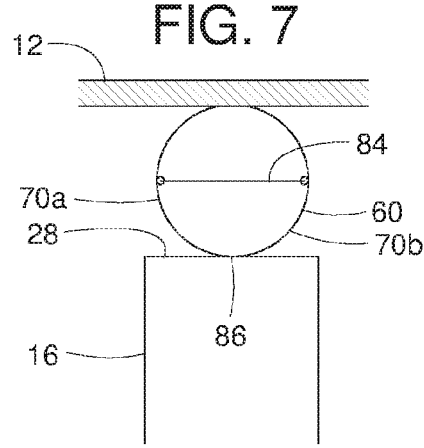
FIG. 7 is a cross-sectional end view of an example supply air duct constructed in accordance with the teachings disclosed herein.
Figure 8:
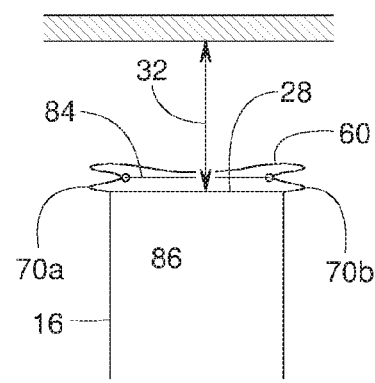
FIG. 8 is a cross-sectional end view similar to FIG. 7 but showing the example air duct in a deflated state as opposed to the inflated state shown in FIG. 7.

In some examples, the cooling system 46 includes means for preventing a collapsed supply air duct 60 from drooping excessively over the sides of the cabinets 16 and/or the computers 14. In the example shown in FIGS. 7 and 8, for instance, an internal restraint 84 (e.g., a string, a strap, a cable, a chain, a horizontal sheet, an elastic cord, a tie rod, etc.) limits the radially outward movement of the sidewalls 70a and 70b as the supply air ducts 60 deflate. FIG. 7 shows the supply air duct 60 in its inflated state, and FIG. 8 shows the supply air duct 60 in its deflated state. In some examples, a pair of taut internal or external restraints (e.g., cables) running parallel to the supply air duct 60 extend along the entire length of the sidewalls 70a and 70b. In some examples, the supply air duct 60 rests upon the top surface 28 such that the weight of the supply air duct is supported by the top surface 28. In some examples, the supply air duct 60 is secured to the top surface 28 to prevent the supply air duct 60 from sliding off the edge of the top surface 28 of the cabinets 16. In some examples, a bottom 86 of the supply air duct 60 rests upon a basket (not shown) rather than directly on the top surface 28 of the cabinets 16, wherein the basket is wider than the top surface 28 of the cabinets 16.

Figure 9:
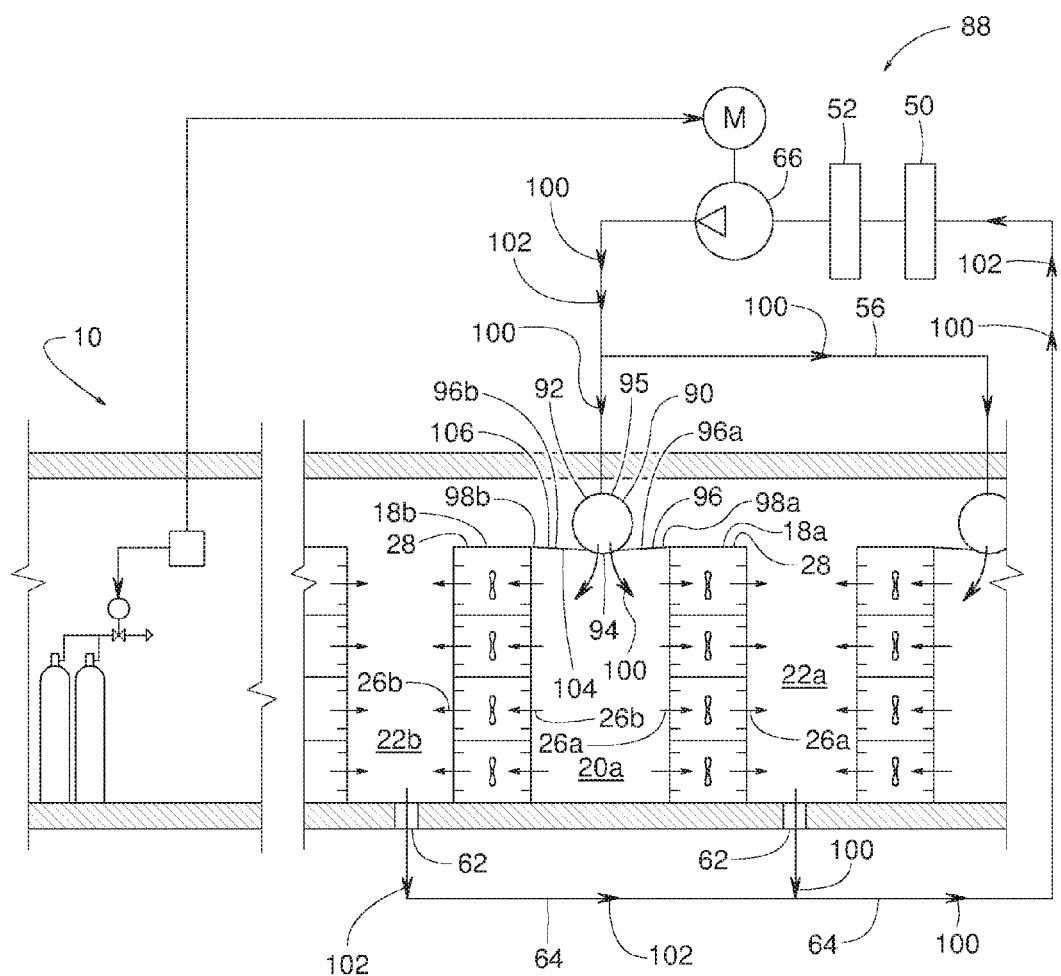
FIG. 9 is a cross-sectional view similar to FIG. 3 but showing another example cooling system constructed in accordance with the teachings disclosed herein.
Figure 10:
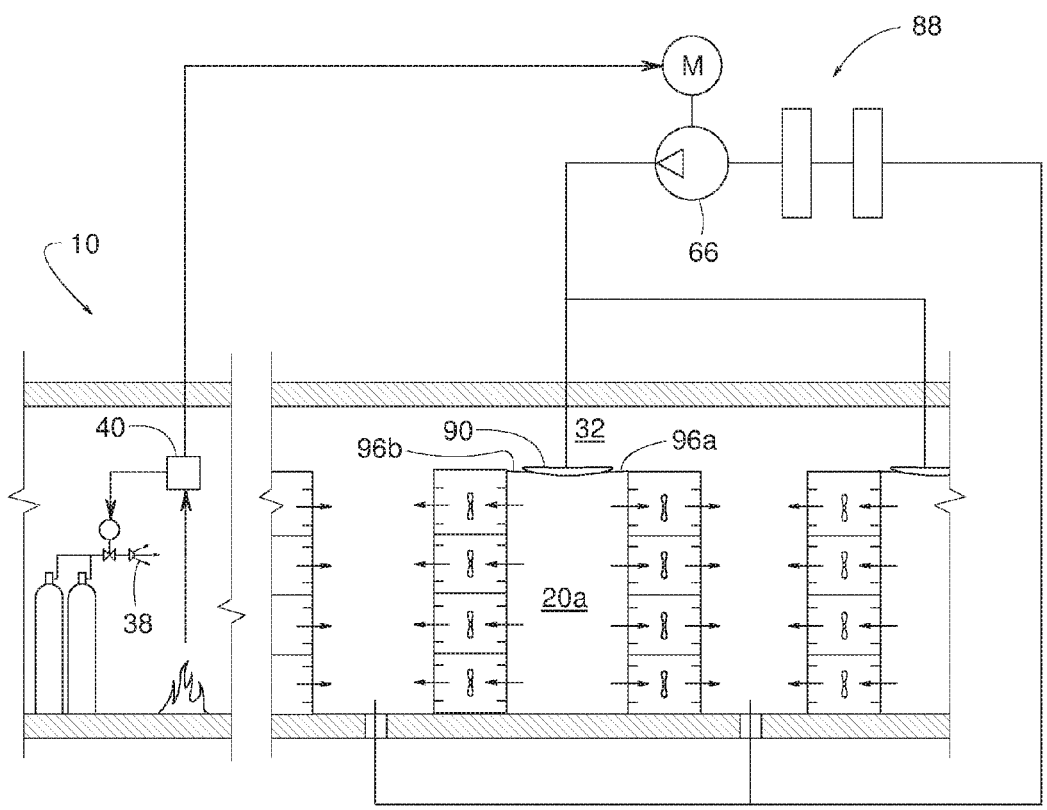
FIG. 10 is a cross-sectional view similar to FIG. 9 but showing the example air ducts in a deflated state as opposed to the inflated state shown in FIG. 9.

FIGS. 9 and 10 show an example cooling system 88 with a supply air duct 90 installed lengthwise (i.e., duct 90 is elongate in a direction parallel to the aisles) over the first cold aisle 20a, between the rows of computer 18a and 18b. In some examples, the supply air duct 90 has a pliable tubular wall 92 that renders the duct 90 inflatable, so the duct 90 has selectively an inflated state (FIG. 9) and a deflated state (FIG. 10). In the illustrated example, the supply air duct 90 has an air permeable lower section 94 for delivering cool supply air into the cold aisle 20a.

To prevent or reduce mixing of air between cold and hot aisles, the supply air duct 90 has an air impermeable upper section 95 and at least one wing 96 (e.g., a first wing 96a and a second wing 96b) extending from the supply air duct 90 toward an adjacent row of computers 18. In the illustrated example, the first wing 96a extends laterally from the supply air duct 90 to a first top surface 28 of the first row of computers 18a (and/or its associated cabinet 16), and the second wing 96b extends to a second top surface 28 of the second row of computers 18b (and/or its associated cabinet 16). In some examples, the wings 96 extend lengthwise substantially the full length of the rows of computer 18 and are made of a pliable sheet of material held taut by having distal edges 98a, 98b fastened to the cabinets 16 of the computer rows 18.

In some examples, the supply air duct 90 is installed at each cold aisle, so when the blower 66 is activated during normal operation, a first supply current of air 100 flows sequentially from the second aisle 22a (the first hot aisle), through the return register 62, through the return air manifold 64, through the filter 50, through the cooling coil 52, through the blower 66, through the supply air manifold 56, lengthwise through the first supply air duct 90, and downward from the first supply air duct 90 into the first aisle 20a (the cold aisle). Further, in the illustrated example, a second supply current of air 102 flows sequentially from the third aisle 22b (the second hot aisle), through the return register 62, through the return air manifold 64, through the filter 50, through the cooling coil 52, through the blower 66, through the supply air manifold 56, lengthwise through the supply air duct 90, and downward from the supply air duct 90 into the first aisle 20a (the cold aisle). The relatively cool air in the first aisle 20a supplies a first current of air 26a flowing through the first row of computers 18a to the second aisle 22a and further supplies a second current of air 26b flowing through the second row of computers 18b to the third aisle 22b.

In the event of a fire-related incident, the sensor 40 deactivates the blower 66 in some examples, which causes the supply air duct 90 to collapse to its deflated state, as shown in FIG. 10. In the deflated state, the collapsed supply air duct 90 opens or unblocks the gap 32 to facilitate the dispersion of the fire extinguishing fluid 38.

Figure 11:
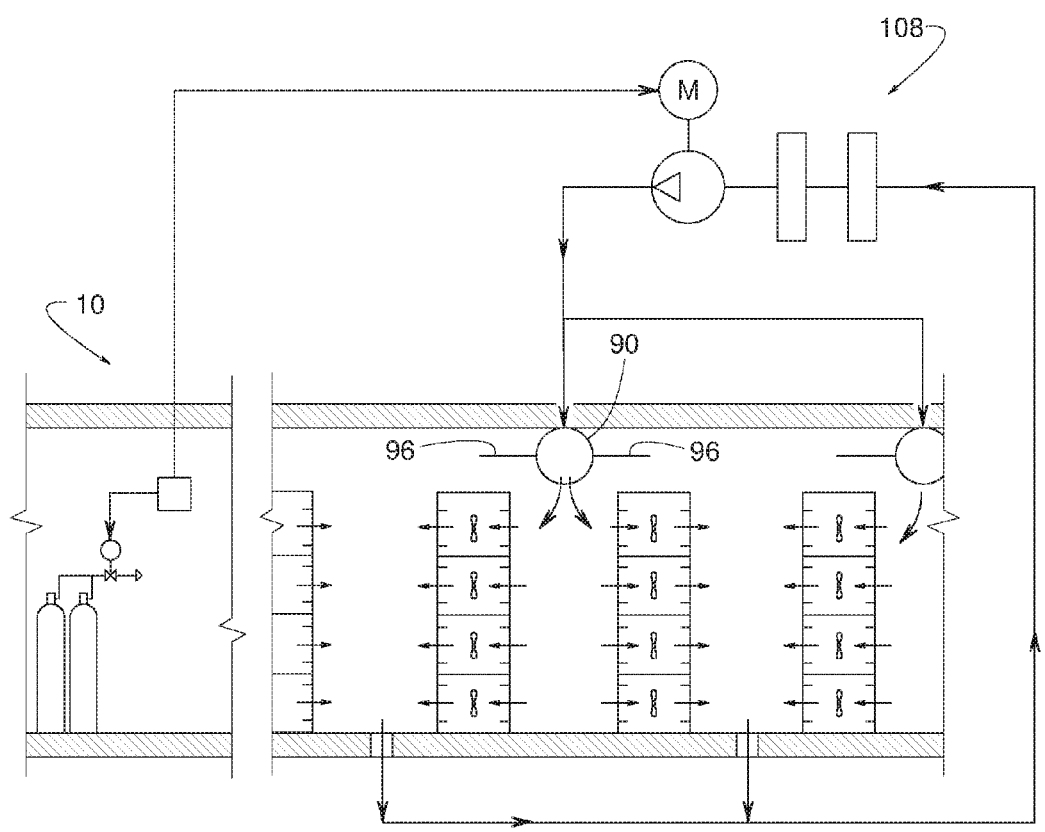
FIG. 11 is a cross-sectional view similar to FIG. 9 but showing another example cooling system constructed in accordance with the teachings disclosed herein.
Figure 12:
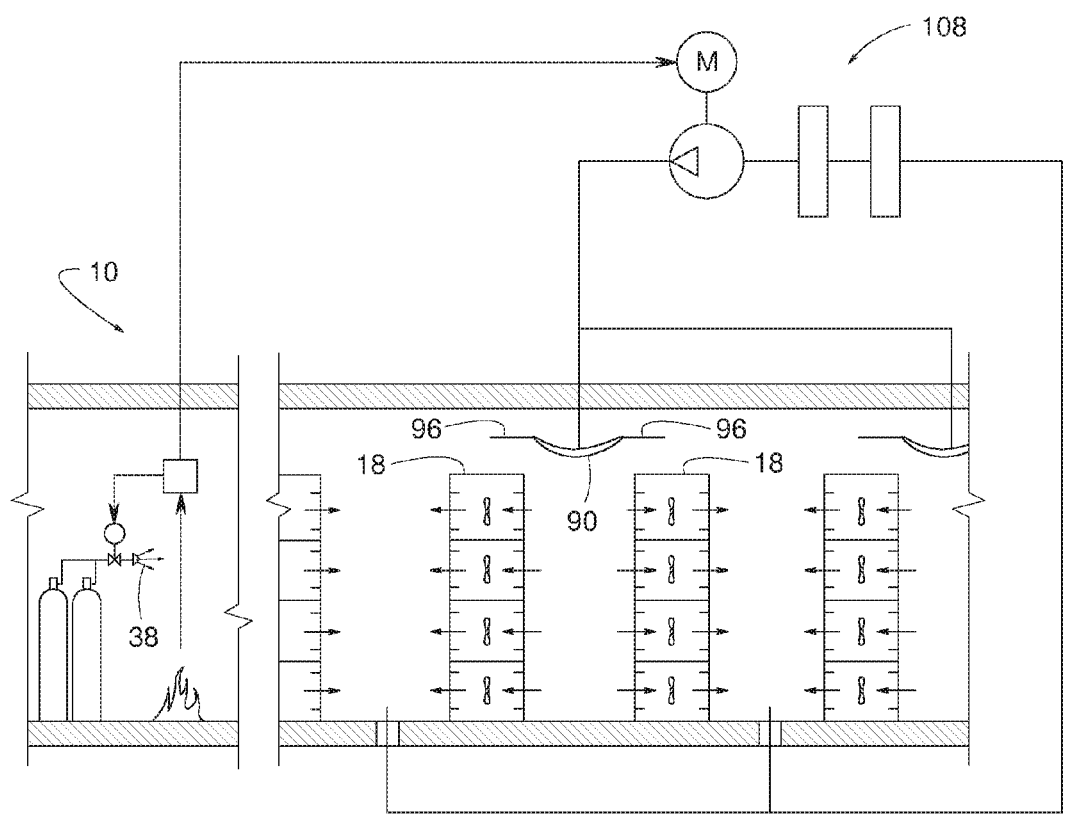
FIG. 12 is a cross-sectional view similar to FIG. 11 but showing the example air ducts in a deflated state as opposed to the inflated state shown in FIG. 11.

FIGS. 11 and 12 show an example cooling system 108 that is similar to the system 88 of FIGS. 9 and 10. With the cooling system 108, however, the supply air duct 90 is elevated to place the wings 96 above and spaced apart from the computer rows 18. The vertical spacing further facilitates the dispersion of the fire extinguishing fluid 38 when needed while reducing the amount of warm air above the supply air duct 90 (e.g., above the wings 96) from being entrained by the cooler air dispersed from the bottom of the supply air duct 90 (e.g., below the wings 96) into the cold aisle. FIG. 11 shows the supply air duct 90 in its inflated state, and FIG. 12 shows the supply air duct 90 in its deflated state. In some examples, the wing 96 extends lengthwise substantially the full length of the rows of computer 18 and is made of a pliable sheet of material. The supply air duct 90 can be supported and the wings 96 can be held taut by any suitable means, such as by a taut cable, a track, struts, and/or combinations thereof.

Figure 15:
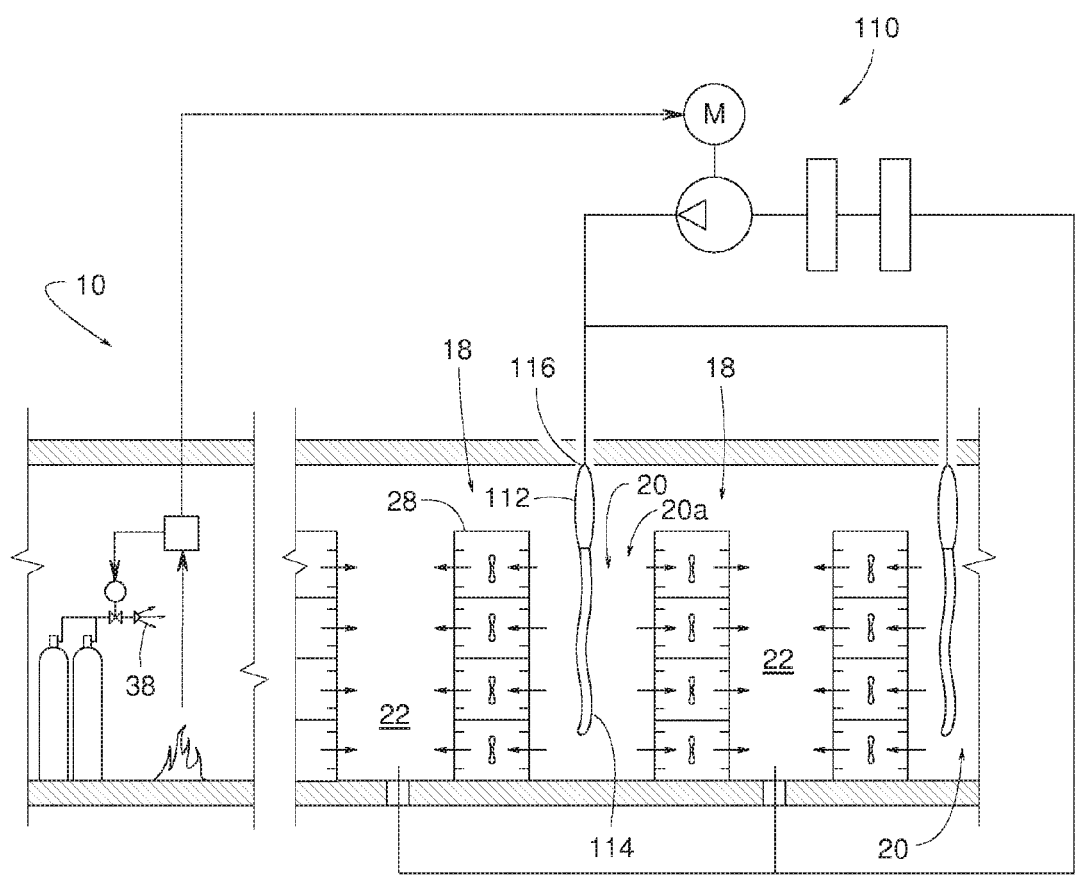
FIG. 15 is a cross-sectional view similar to FIG. 13 but showing the example air ducts in a deflated state as opposed to the inflated state shown in FIG. 13.

FIGS. 13-15 show an example cooling system 110 that provides a more concentrated discharge of cool supply air directly in the cold aisles 20, thereby reducing (e.g., minimizing) the mixing of cool air with warmer air in the hot aisles 22. In the illustrated example, a supply air duct 112 with a plurality of branch air ducts 114 are installed in each cold aisle 20. FIGS. 13 and 14 show at least one of the air ducts in an inflated state, and FIG. 15 shows at least one of them in a deflated state. The supply air duct 112 is elevated with an upper section 116 that is higher than the top surface 28 of the rows of computer 18 to provide head clearance for personnel in the area and to facilitate the dispersion of the fire extinguishing fluid 38 when needed.

To ensure that the branch air ducts 114 inject cool air well into the cold aisle 20, a lowermost distal point 118 of the branch air duct 114 extends lower than the top surface 28 of the computer rows 18, and the distal point 118 lies within a certain row length 120 of the row of computers 18. That is, the distal point 118 is positioned within a length of the cold aisle 20 defined by ends of the row of computers 18. The branch air ducts 114 include an air permeable tubular wall 122 made of a pliable material so that personnel working in the aisle can simply shove branch air ducts aside to gain unobstructed access to the computers 14.

During normal operation, as shown in the illustrated examples of FIGS. 13 and 14, a main current of air 124 flows sequentially from the second aisle 22a (the first hot aisle), through the return air register 62, through the return air manifold 64, through the filter 50, through the cooling coil 52, through the blower 66, through the supply air manifold 126, into the supply air duct 112, lengthwise through the supply air duct 112, downward from the supply air duct 112 through the branch air ducts 114, and outward from the branch air ducts 114 into the first aisle 20a (the cold aisle). The main current of air 124 in the first aisle 20a supplies a first current of air 26a through the first row of computers 18a and a second current of air 26b through the second row of computers 18b.

Figure 16:
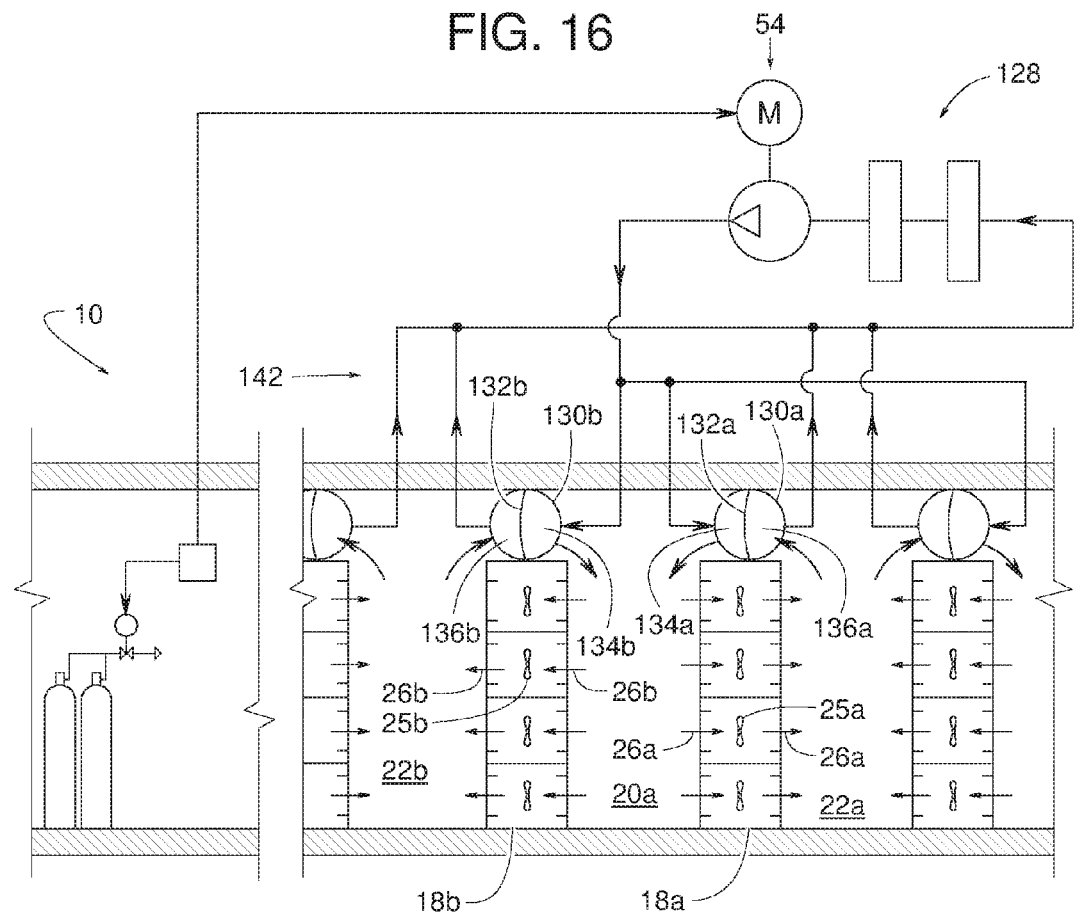
FIG. 16 is a cross-sectional view similar to FIG. 3 but showing another example cooling system constructed in accordance with the teachings disclosed herein.
Figure 17:
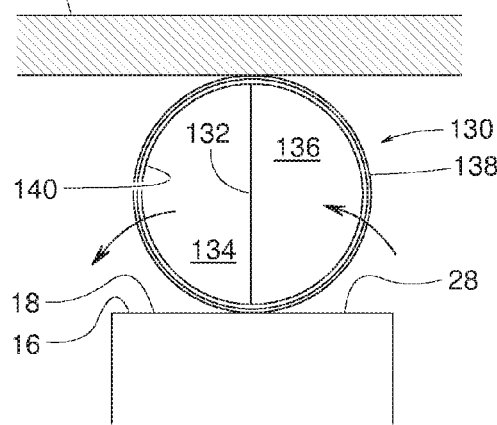
FIG. 17 is a cross-sectional view similar to FIG. 16 but showing just a single example air duct.

FIGS. 16 and 17 show an example cooling system 128 that has an air duct 130 (e.g., air duct 130a and 130b) atop each row of computers 18, wherein the air duct 130 has a longitudinal internal web 132 (e.g., first web 132a in the first air duct 130a and second web 132b in the second air duct 130b) that separates each air duct 130 into a supply chamber 134 (e.g., 134a and 134b) and a return chamber 136 (e.g., 136a and 136b). The air duct 130 has a pliable tubular wall 138 that is air permeable to pass air from the hot aisle 22a into the return chamber 136 and to release air from the supply chamber 134 to the cold aisle 20a. The blower 66 and the internal fans 25 drive the movement of air. To reduce the likelihood of the negative pressure in the return chamber 136 causing the air duct's pliable tubular wall to collapse, the air duct 130 includes some form of framework 140 that holds the air duct 130 in an expanded shape. Examples of the framework 140 include a plurality of rigid hoops, a longitudinal tensioning device, and combinations thereof.

In the illustrated example, the first row of computers 18a is between the first aisle 20a (the cold aisle) and the second aisle 22a (the first hot aisle), and the second row of computers 18b is between the first aisle 20a (the cold aisle) and the third aisle 22b (the second hot aisle). In this example, the cooling system 128 includes the first air duct 130a atop the first row of computers 18a, the second air duct 130b atop the second row of computers 18b, the first web 132a dividing the first air duct 130a into a first return chamber 136a and a first supply chamber 134a, the second web 132b dividing second the air duct 130b into a second return chamber 136b and a second supply chamber 134b, the blower system 54, a first fan 25a for urging a first current of air 26a through the first row of computers 18a, and a second fan 25b for urging a second current of air 26b through the second row of computers 18b.

During normal operation of the example cooling system 128, the blower system 54 draws air from the second aisle 22a (the first hot aisle) into the first return chamber 136a, the blower system 54 urges air from the first return chamber 136a into the first supply chamber 134a via a network of air ducts 142, and the blower system 54 urges air from the first supply chamber 134a into the first aisle 20a (the cold aisle). Similarly, in the illustrated example, the blower system 54 draws air from the third aisle 22b (the second hot aisle) into the second return chamber 136b, the blower system 54 urges air from the second return chamber 136b into the second supply chamber 134b via the air ducts 142, and the blower system 54 urges air from the second supply chamber 134b into the first aisle 20a (the cold aisle).

FIGS. 18 and 19 show an example adjustable or fixed-position nozzle 76 that can be used to direct a main current of air 144 discharged from the nozzle. Further, the example nozzle 76 can also be used for inducing surrounding air currents 146 to flow in the same general direction as the main current of air 144. In some examples, the surrounding air currents 146 are from the air released through the air permeable sidewall of a pliable air duct in the area surrounding the nozzle 76. The nozzle 76 and the principle of inducing and directing surrounding air currents can be applied to any of the air duct examples shown in FIGS. 3-23.

FIGS. 20-23 show example internal baffles 198, 200 that can be used to reduce negative effects that might otherwise result due to the dynamic air pressure of unrestricted air rushing axially through a supply air duct 202, 204. For instance, without the baffles 198, 200, air released through the air permeable sidewall of the ducts 202, 204 might tend to follow the axial longitudinal direction of the air flowing lengthwise through the duct rather than discharging from the duct in an often more desirable radial direction (perpendicular to the duct's length). In the illustrated example, the internal baffles 198, 200 interrupt the axial or longitudinal velocity of the air entering axial at the end 74 of the corresponding supply air ducts 202, 204. The internal baffles 198, 200 may be applied to any of the air duct examples shown in FIGS. 3-23.

In the example shown in FIGS. 20 and 22, the supply air duct 202 includes an air permeable pliable outer wall 206 and the internal baffle 198 that is horizontally elongate. In this example, the internal baffle 198 is tubular (e.g., conical or cylindrical). In the illustrated example, the internal baffle 198 separates an interior space of the supply air duct 202 into an inner upstream chamber 208 and an outer downstream chamber 210. A supply current of air 212 flows sequentially from the second aisle 22a (a hot aisle) through a cooling system, lengthwise through the upstream chamber 208, radially outward through the internal baffle 198, through the downstream chamber 210, radially outward through an air permeable pliable outer wall 214 of the supply air duct 202, and downward from the supply air duct 202 into the first aisle 20a (a cold aisle). The air may then pass through the row of computers 18a and into second aisle 22a (the hot aisle). In some examples, the cooling system includes the return register 62, the blower system 54, and suitable ductwork to return the air back to the upstream chamber 208 at the axial end 74 of the supply air duct 202 to repeat the circuit.

In the example shown in FIGS. 21 and 23, the supply air duct 204 includes an air permeable pliable outer wall 216 and the internal baffle 200 that is horizontally elongate. In this example, the internal baffle 200 is generally planar. In the illustrated examples, the internal baffle 200 separates an interior space of supply air duct 204 into an inner upstream chamber 218 and an outer downstream chamber 220. A supply current of air 212 flows sequentially from the second aisle 22a (a hot aisle) through a cooling system, lengthwise through the upstream chamber 218, radially outward through the internal baffle 200, through the downstream chamber 220, radially outward through an air permeable pliable outer wall 222 of the supply air duct 204, and downward from the supply air duct 204 into the first aisle 20a (cold aisle). The air may then pass through the row of computers 18a and into second aisle 22a (the hot aisle). In some examples, the cooling system includes the return register 62, the blower system 54, and suitable ductwork to return the air back to the upstream chamber 218 at the axial end 74 to repeat the circuit.

Figure 24:
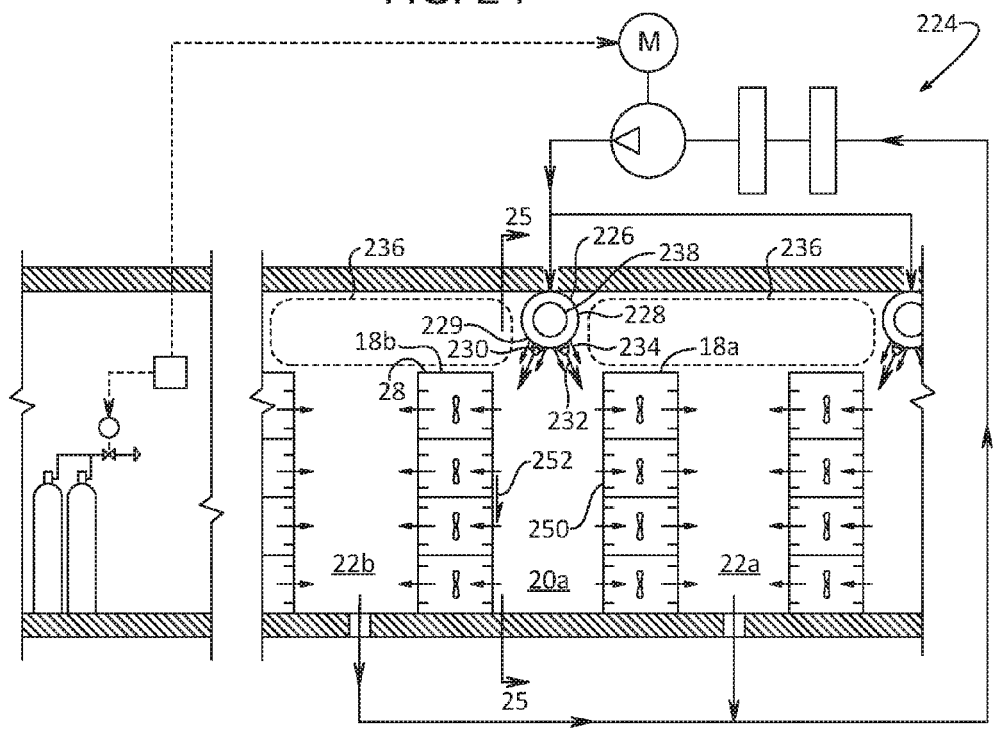
FIG. 24 is a cross-sectional view similar to FIG. 3 but showing another example cooling system constructed in accordance with the teachings disclosed herein.
Figure 25:
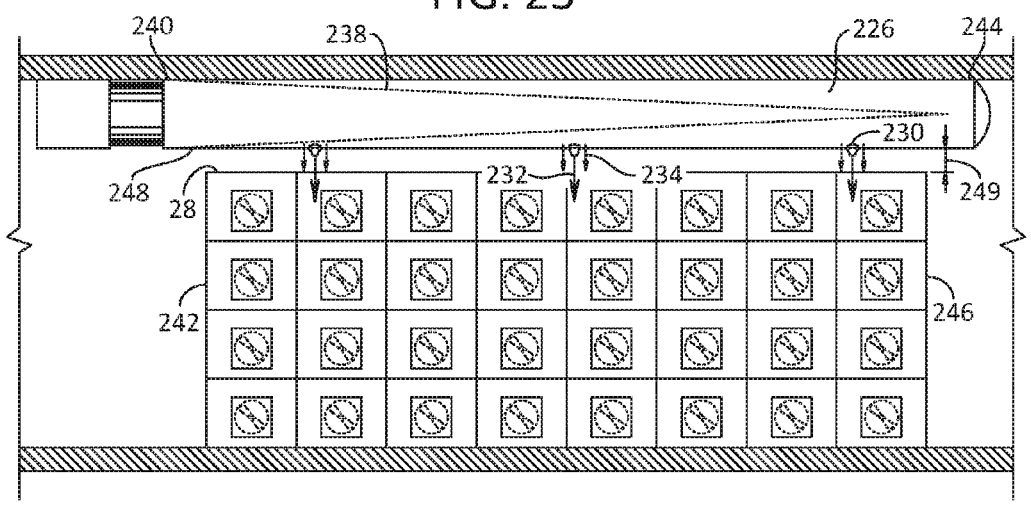
FIG. 25 is a cross-sectional view taken along line 25-25 of FIG. 24.

FIGS. 24 and 25 show an example cooling system 224 with a supply air duct 226 installed above the first cold aisle 20a, between the rows of computer 18a, 18b. In some examples, the supply air duct 226 has a pliable tubular wall 228 that renders the duct 226 inflatable. In the illustrated example, the supply air duct 226 has an air permeable lower section 229 for delivering conditioned (e.g., cool) air into the cold aisle 20a. In some examples, the entire pliable tubular wall 228 may be air permeable.

In the illustrated example, adjustable or fixed-position nozzles 230 are attached to the wall 228 of the supply air duct 226 similar to those shown in FIGS. 18 and 19. In some examples, the nozzles 230 provide a discharge path through which a main discharge current of air 232 is directed out from an interior of the supply air duct 226 toward the cold aisle 20a. In some examples, the nozzles 230 are structured to entrain surrounding air currents 234 to flow in the same general direction as the main discharge current of air 232. More particularly, in some examples, the surrounding air currents 234 entrained by the main current of air 232 from the nozzles 230 correspond to the air passing through the air permeable portion of the tubular wall 228 of the supply air duct 226. That is, in some examples, the nozzles 230 are positioned on the air duct 226 such that the wall 228 surrounding the nozzle is air permeable. In some examples, the nozzles 230 are structured and positioned to entrain conditioned air passing through the air permeable wall 228 without entraining warmer ambient air 236 above the rows of computers 18. In some examples, a majority of the air delivered by the supply air duct 226 is provided through the discharge path. In other examples, a majority of the air delivered by the supply air duct is provided through the air permeable portion of the wall 228.

In the illustrated example, the supply air duct 226 includes an internal baffle 238 that is horizontally elongate. In this example, the internal baffle 238 is similar in construction to the tubular (e.g., conical or cylindrical) internal baffle 198 described above in connection with FIGS. 20 and 22. That is, the internal baffle 238 is air permeable and serves to increase the even distribution of conditioned air along the air duct 226 passing through the air permeable outer wall 228 into the cold aisle 20a. The even distribution of air flow enables the temperature within the cold aisle 20a to be substantially uniform along the length of the cold aisle 20a (e.g., within +/−2 degrees Fahrenheit of the temperature of air exiting the supply air duct 226 (i.e., the temperature of the air currents 232, 234)).

Further, in some examples, to increase the even distribution of air delivered along the length of the aisle 20a, the air duct 226 begins and ends beyond the beginning and ending of the cold aisle 20a. That is, as shown in FIG. 25, an upstream end 240 of the supply air duct 226 is positioned outside a first end 242 of the row of computers 18 while a downstream end 244 of the supply air duct 226 is positioned outside of a second end 246 of the row of computers 18. In some examples, ones of the nozzles 230 may be positioned proximate to the upstream and downstream ends 240, 244 of the supply air duct 226 to be beyond the first and second ends 242, 246 of the row of computers 18.

As shown in the illustrated example, the supply air duct 226 is spaced apart and disconnected from the rows of computers 18 such that the cold aisle 20a is in unobstructed fluid communication with the adjacent hot aisles 22a, 22b over the top of the rows of computers 18. That is, unlike the example of FIGS. 9 and 10 that show wings 96 connecting the air duct 90 to the rows of computers 18a, 18b, the air duct 226 in the example of FIGS. 24 and 25 is not connected to the rows of computers 18a, 18b. This configuration reduces the complexity of the cooling system 224 relative to FIG. 9. Furthermore, the unobstructed fluid paths over top of the rows of computers 18 enables the fire extinguishing fluid 38 (FIG. 4) in a gaseous state to readily disperse over, around and through the multiple rows of computers 18, regardless of whether the air duct 226 is inflated or deflated.

With the unobstructed fluid path over top of the rows of computers 18, there is the possibility that warm air within the hot aisles 22a, 22b may rise to mix with the ambient air 236 above the rows of computers 18 and then mix with the cool air within the cold aisle 20a. However, testing has shown that when a bottom 248 of the air duct 226 is above a top surface 28 of the rows of computers 18 a distance 249 that is less than or equal to about 30 inches, the warm air within the hot aisles 22a, 22b and/or the ambient air 236 above the rows of computers 18 can be substantially prevented from mixing with the cool conditioned air within the cold aisle 20a when constructed as shown and described in FIGS. 24 and 25. More particularly, as the internal baffle 238 substantially evenly distributes the release of conditioned air along the length of the aisle 20 and the nozzles 230 are structured to entrain the conditioned air passing through the permeable wall 228 of the supply air duct 226, the mixing of the ambient air 236 and the conditioned air will be reduced and/or substantially prevented without a structural barrier above the rows of computers 18 to partition the different aisles 20, 22.

In some examples, reducing the mixing of warm air in the hot aisles 22 and above the rows of computers 18 (e.g., the ambient air 236) with the cool conditioned air within the cold aisle 20 depends upon the internal fans 25 associated with the rows of computers 18 being able to adequately blow air from the cold aisle 20a to the hot aisles 22a, 22b as the cold aisle 20a receives conditioned air via the supply air duct 226. In some examples, the internal fans 25 can adequately move the air when a velocity of air within the cold aisle 20a in a direction 250 parallel to the facing surfaces of the rows of computers 18 (e.g., in a direction crossing an inlet 252 of the air passageway 24 between the cold aisle 20a and the hot aisles 22a, 22b) is maintained below a threshold in a region adjacent the facing surfaces of the rows of computers 18. More particularly, in some examples, in a region immediately adjacent (e.g., within approximately 1 inch of) the inlets 252 on the facing surfaces of the rows of computers 18 the velocity of air is maintained at or below approximately 400 feet per minute. In a region between approximately 1 inches and 10 inches from the inlets 252, the velocity may reach up to 1000 feet per minute. This can be accomplished by appropriately designing the nozzles 230, establishing substantially even release of air along the length of the air duct 226 (using the internal baffle 238), and controlling the overall flow of air through the air duct 226 and out through the air permeable wall 228.

Figure 26:
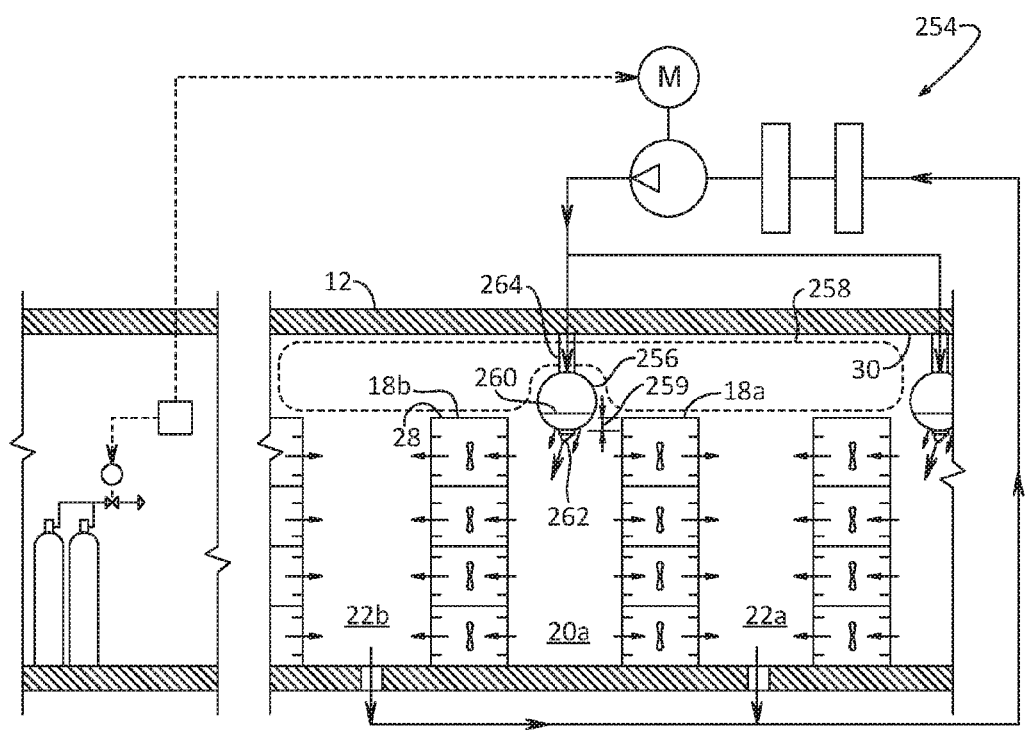
FIG. 26 is a cross-sectional view similar to FIG. 24 but showing another example cooling system constructed in accordance with the teachings disclosed herein.

FIG. 26 is a cross-sectional view similar to FIG. 24 but showing another example cooling system 254 with a supply air duct 256 constructed in accordance with the teachings disclosed herein. The example cooling system 254 operates on the same principle as the example of FIG. 24 described above. That is, the position and design of the supply air duct 256 is such that the mixing of ambient air 258 above the rows of computers 18 is substantially prevented through the use of an internal baffle 260 to evenly distribute conditioned air passing delivered by the supply air duct 256 and nozzles 262 to discharge a main current of air that entrains surrounding air passing through the permeable wall of the supply air duct 256. In the illustrated example, the internal baffle is similar to the generally planar internal baffle 200 described above in connection with FIGS. 21 and 23. The nozzles 262 of FIG. 26 may be similar to the nozzles 230 of FIGS. 24 and 25. However, as shown in the illustrated example, the nozzles 262 are located in a different position and directed at a different angle. The nozzles 230, 262 of FIGS. 24-26 may be placed in other locations along the corresponding air ducts 226, 256 and directed at suitable angles depending upon the particular circumstances in which the nozzles 230, 262 are to be implemented.

Whereas the bottom 248 of the air duct 226 of FIGS. 24 and 25 is positioned a distance 249 above the top surface 28 of the rows of computers 18, the bottom of the air duct 256 of FIG. 26 is below the top surface 28 of the rows of computers 18. The lower air duct 256, in the illustrated example of FIG. 26, is spaced apart from the overhead surface (ceiling) 30 of the building 12 but connected thereto by an overhead support structure 264. Thus, as shown in the illustrated example, the ambient air 258 on either side of the air duct 256 may be in fluid communication over top of the air duct 256. This should not affect the ability of the air duct 256 to substantially prevent the ambient air 258 from mixing with the conditioned (e.g., cool) air in the cold aisle 20a. In particular, testing has shown that when a bottom 248 of the air duct 226 is below the top surface 28 of the rows of computers 18 a distance 259 less than or equal to about 6 inches the ambient air 258 above the rows of computers 18 can be substantially prevented from mixing with the cool conditioned air within the cold aisle 20a when constructed as shown and described above. In some examples, the bottom of either air duct 226, 256 of FIGS. 24-26 is approximately level with the top surface 28 of the rows of computers 18. Thus, as disclosed herein, it is possible to substantially prevent the mixing of ambient air above the rows of computers 18 with cool air within the cold aisle 20a without a structural barrier above the rows of computers 18 to partition the different aisles 20, 22 when the bottom of the air duct 226, 256 is at a height ranging between approximately 6 inches below and 30 inches above a top surface 28 of the rows of computers 18. This is facilitated when the air duct is constructed to maintain a substantially uniform temperature within the cold aisle 20a (e.g., within +/−2 degrees Fahrenheit of the temperature of air exiting the supply air duct 226, 256) and the velocity of air crossing the inlets 252 of the air passageways 24 through the rows of computers 18 is maintained less than or equal to about 400 feet per minute.

Although certain example methods, apparatus and articles of manufacture have been described herein, the scope of the coverage of this patent is not limited thereto. On the contrary, this patent covers all methods, apparatus and articles of manufacture fairly falling within the scope of the appended claims either literally or under the doctrine of equivalents.

What is claimed is:

1. A cooling system, comprising:
   an inflatable air duct to be positioned above a cold aisle defined between two rows of electronic equipment, the inflatable air duct to extend along a length of the cold aisle, the inflatable air duct to be air permeable to deliver conditioned air into the cold aisle, the electronic equipment having fans to force cool air within the cold aisle through the electronic equipment to adjacent hot aisles on opposite sides of the two rows of the electronic equipment, the inflatable air duct to be spaced apart from the rows of the electronic equipment such that the cold aisle is in unobstructed fluid communication with the adjacent hot aisles over tops of the rows of the electronic equipment, the conditioned air delivered from the inflatable air duct to reduce a mixing of warm air in the hot aisles with the cool air in the cold aisle; and
   a nozzle to be attached to a wall of the inflatable air duct, the nozzle providing a discharge path for the conditioned air from an interior of the inflatable air duct toward the cold aisle, the nozzle to guide a discharge current of air through the discharge path, the wall surrounding the nozzle to be air permeable, the discharge current of air to entrain the conditioned air passing through the air permeable wall, a velocity of the discharge current of air to be insufficient to entrain ambient air above the two rows of the electronic equipment.

2. The cooling system of claim 1, further including an internal baffle extending along the interior of the inflatable air duct to increase even distribution of the conditioned air delivered along a length of the inflatable air duct.

3. The cooling system of claim 2, wherein the even distribution of the conditioned air is to maintain the cool air at a substantially uniform temperature along the length of the cold aisle that is within 2° F. of a temperature of the conditioned air delivered from the inflatable air duct.

4. The cooling system of claim 1, wherein at least one of an upstream end of the inflatable air duct or a downstream end of the inflatable air duct is to extend beyond an end of the cold aisle.

5. The cooling system of claim 1, wherein a bottom of the inflatable air duct is to be less than approximately 6 inches below a height of a top surface of cabinets defining the two rows of the electronic equipment.

6. The cooling system of claim 1, wherein a bottom of the inflatable air duct is to be less than approximately 30 inches above a height of a top surface of the two rows of the electronic equipment.

7. The cooling system of claim 1, wherein a bottom portion of the inflatable air duct is more permeable than a top portion of the inflatable air duct.

8. A cooling system, comprising:
   an inflatable air duct to be positioned above a cold aisle defined between two rows of electronic equipment, the inflatable air duct to extend along a length of the cold aisle, the inflatable air duct to be air permeable to deliver conditioned air into the cold aisle, the electronic equipment having fans to force cool air within the cold aisle through the electronic equipment to adjacent hot aisles on opposite sides of the two rows of the electronic equipment, the inflatable air duct to be spaced apart from the rows of the electronic equipment such that the cold aisle is in unobstructed fluid communication with the adjacent hot aisles over tops of the rows of the electronic equipment, the conditioned air delivered from the inflatable air duct to reduce a mixing of warm air in the hot aisles with the cool air in the cold aisle, wherein a velocity of air within the cold aisle in a direction extending parallel to facing surfaces of the two rows of the electronic equipment and in a region within approximately 1 inch of the facing surfaces is maintained at or below approximately 400 feet per minute.

9. A cooling system for a datacenter in a building, the cooling system comprising:
   an inflatable air duct extending lengthwise along a first aisle within the building defined between a first row of computers and a second row of computers, the first row of computers between the first aisle and a second aisle, the second row of computers between the first aisle and a third aisle, conditioned air delivered to the first aisle via the inflatable air duct in a manner that substantially prevents mixing of ambient air above the first and second rows of computers with air in the first aisle without a structural barrier above the first and second rows of computers to partition the first, second, and third aisles; and a nozzle to be attached to the inflatable air duct, the nozzle to guide a discharge current of air from an interior of the inflatable air duct to an exterior of the inflatable air duct, a velocity of the discharge current of air to be insufficient to entrain ambient air above the first and second rows of computers.

10. The cooling system of claim 9, wherein a bottom portion of the inflatable air duct includes an air permeable wall, the conditioned air to pass through the air permeable wall toward the first aisle.

11. The cooling system of claim 10, further including an internal baffle extending along the interior of the inflatable air duct to increase even distribution of the conditioned air passing through the air permeable wall along a length of the inflatable air duct.

12. The cooling system of claim 11, wherein the even distribution of the conditioned air is to maintain the air within the first aisle at a substantially uniform temperature along the length of the first aisle that is within 2° F. of a temperature of the conditioned air delivered from the inflatable air duct.

13. The cooling system of claim 10, wherein the nozzle is to be attached to the bottom portion of the inflatable air duct such that the air permeable wall surrounds the nozzle, the discharge current of air to entrain the conditioned air passing through the air permeable wall.

14. The cooling system of claim 9, wherein a bottom of the inflatable air duct is to be positioned at a height between approximately 6 inches below a top surface of the first and second rows of computers and approximately 30 inches above the top surface of the first and second rows of computers.

15. A cooling system for a datacenter in a building, the cooling system comprising:

an inflatable air duct extending lengthwise along a first aisle within the building defined between a first row of computers and a second row of computers, the first row of computers between the first aisle and a second aisle, the second row of computers between the first aisle and a third aisle, conditioned air delivered to the first aisle via the inflatable air duct in a manner that substantially prevents mixing of ambient air above the first and second rows of computers with air in the first aisle without a structural barrier above the first and second rows of computers to partition the first, second, and third aisles, a bottom portion of the inflatable air duct including an air permeable wall, the conditioned air to pass through the air permeable wall toward the first aisle; and an internal baffle extending along an interior of the inflatable air duct to increase even distribution of the conditioned air passing through the air permeable wall along a length of the inflatable air duct, wherein the even distribution of the conditioned air maintains a velocity of air moving along regions within the first aisle immediately adjacent facing surfaces of the first and second rows of computers at or below approximately 400 feet per minute in a direction parallel to the facing surfaces.

16. A cooling system for a datacenter, wherein the datacenter includes a plurality of computers arranged in a row within a building, the row of computers disposed between a cold aisle and a hot aisle, the row of computers defining an air passageway between the cold aisle and the hot aisle, the cooling system comprising:

an inflatable air duct to be positioned above the cold aisle and spaced apart from the row of computers such that a path between the hot aisle and the cold aisle over a top of the row of computers is unobstructed, the inflatable air duct to deliver conditioned air to the cold aisle via an air permeable wall;

a baffle to be within the air duct to facilitate even distribution of the conditioned air through the air permeable wall along a length of the inflatable air duct; and a nozzle to be attached to the air permeable wall, air flow through the air permeable wall and through the nozzle to substantially prevent a flow of air along the path from the hot aisle to the cold aisle over the top of the row of computers; a velocity of the air flow through the nozzle to be insufficient to entrain ambient air above the row of computers.

* * * * *